United States Patent
Kaidu et al.

(10) Patent No.: US 10,749,452 B2
(45) Date of Patent: Aug. 18, 2020

(54) MOTOR DRIVING SYSTEM, MOTOR DRIVING CONTROL DEVICE, AND NON-TRANSITORY COMPUTER READABLE MEDIUM FOR MOTOR DRIVING CONTROL DEVICE

(71) Applicant: MINEBEA MITSUMI Inc., Nagano (JP)

(72) Inventors: Hiroyuki Kaidu, Kakegawa (JP); Masato Aoki, Iwata (JP); Xiao Zhou, Fukuroi (JP); Mitsunari Terada, Fukuroi (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 16/241,110

(22) Filed: Jan. 7, 2019

(65) Prior Publication Data
US 2019/0229651 A1   Jul. 25, 2019

(30) Foreign Application Priority Data
Jan. 24, 2018   (JP) .................................. 2018-009551

(51) Int. Cl.
*H02P 5/68*   (2006.01)
*G05B 11/10*  (2006.01)
*H05K 7/20*   (2006.01)

(52) U.S. Cl.
CPC .............. *H02P 5/68* (2013.01); *G05B 11/10* (2013.01); *H05K 7/20136* (2013.01)

(58) Field of Classification Search
CPC ........ H02P 5/68; H05K 7/20136; G05B 11/10
(Continued)

(56) References Cited

U.S. PATENT DOCUMENTS 8,228,009 B2 *   7/2012   Purcell .................... B64C 13/24
                                                    318/34
8,497,642 B2 *   7/2013   Yasohara ............... G03G 15/80
                                                    318/113
(Continued)

FOREIGN PATENT DOCUMENTS

JP   04-69099 A    3/1992
JP   08-141957 A   6/1996
(Continued)

OTHER PUBLICATIONS

Japanese Office Action dated Jun. 18, 2020 for corresponding Japanese Application No. 2018-009551 and English translation.

*Primary Examiner* — David Luo
(74) *Attorney, Agent, or Firm* — Pearne & Gordon LLP

(57) ABSTRACT

A motor driving system has a first motor, a first motor driving control device for driving the first motor, a second motor, a second motor driving control device for driving the second motor, a controller performing communication with the first motor driving control device and the second motor driving control device, a first communication line for connecting a common terminal of the controller and the first motor driving control device; a second communication line for connecting the common terminal and the second motor driving control device, and a switch unit capable of switching each of the first and second communication lines between an enable state in which communication is possible by the communication line and an disable state in which communication is impossible under control of the controller. The controller controls the switch unit to set either the first or the second communication line to the enable state.

13 Claims, 7 Drawing Sheets

(58) Field of Classification Search
USPC .................................................. 318/51, 34
See application file for complete search history.

(56) References Cited

U.S. PATENT DOCUMENTS

| | | | |
|---|---|---|---|
| 8,680,805 B2 * | 3/2014 | Sonoda | H02P 5/50 |
| | | | 318/400.14 |
| 2009/0079372 A1 | 3/2009 | Takeuchi | |
| 2013/0112133 A1 | 5/2013 | Asensio et al. | |
| 2016/0239008 A1 | 8/2016 | Tanaka et al. | |

FOREIGN PATENT DOCUMENTS

| | | |
|---|---|---|
| JP | 10-42592 A | 2/1998 |
| JP | 2000-155608 A | 6/2000 |
| JP | 2001-286187 A | 10/2001 |
| JP | 2008-022638 A | 1/2008 |
| JP | 2012-060701 A | 3/2012 |
| JP | 2013-509150 A | 3/2013 |
| JP | 6233418 B2 | 11/2017 |

* cited by examiner

MOTOR DRIVING SYSTEM, MOTOR DRIVING CONTROL DEVICE, AND NON-TRANSITORY COMPUTER READABLE MEDIUM FOR MOTOR DRIVING CONTROL DEVICE

CROSS REFERENCE TO RELATED APPLICATIONS

This application claims the benefit of Japanese Patent Application No. 2018-009551, filed Jan. 24, 2018, which is hereby incorporated by reference in its entirety.

BACKGROUND

Technical Field

The present disclosure relates to a motor driving system, a motor driving control device, a control method of a motor driving control device, and a control program for a motor driving control device, and particularly to a motor driving system, a motor driving control device, a control method of a motor driving control device, and a control program for a motor driving control device that control driving of a motor without requiring their own identification information.

Background

Motor driving systems for controlling plural motor driving control devices by one control device and driving a motor connected to each of the motor driving control devices are known. Some of the motor driving systems as described above are used in, for example, electronic computers or the like, and drive plural fan motors arranged in each portion of the electronic computer by one control device to cool the electronic computer.

In some of such motor driving systems, each motor driving control device is caused to execute a different operation by performing the control based on the control device with ID information (identification information such as an identification code) written in each motor driving control device. For example, the ID information of a motor driving control device as an instruction target is contained in instruction information output from the control device, whereby an instruction on rotational speed or the like can be made to a specific motor driving control device as an instruction target. When the motor driving control device receives instruction information including ID information of the motor driving control device itself (its own device), the motor driving control device controls driving of the motor based on the instruction information.

A motor driving system is assumed which controls plural fan motors for blowing air to different cooling targets respectively by using one control device, for example, in such a manner that a first fan motor targets a cooling target A for cooling, a second fan motor targets a cooling target B for cooling, etc. Performing different control for each fan motor in such a manner as to rotate the first fan motor at a speed of 10000 rpm, rotate the second fan motor at a speed of 4000 rpm, etc. may be required in this type of motor driving system.

In such a case, for example, ID information is written in each fan in advance, and the ID information is included in instruction information from the control device, thereby enabling each fan motor to determine whether the instruction information is addressed to the fan motor itself and perform different control by each fan motor.

Japanese Patent Laid-Open No. 2001-286187 describes the configuration of an electric equipment system that includes plural fan motor control units configured to control fan motors and a system control unit configured to control the electric equipment system, and controls plural fan motors by performing data communication between the system control unit and the plural fan motor control units.

Japanese Patent No. 6,233,418 describes the configuration of a motor control program transfer system comprising: an upper controller including a memory for storing a motor control program of a motor control device, an identification information allocating unit for repeatedly performing an operation of allocating unique identification information to the motor control device having specific initial identification information, and a motor control program transfer unit for transferring a motor control program to the motor control device to which the unique identification information is allocated; one or more motor control devices each of which includes a volatile memory for storing a motor control program, and an identification information holding unit for rewritably holding identification information for identifying itself and holding initial identification information in an initial state, and is capable of communicating information with the upper controller; and an information communication switching unit for making information communication of one motor control device with the upper controller effective in the initial state, and newly making information communication of one motor control device with the upper controller effective each time the unique identification information is allocated to the motor control device.

For example, when plural fan motors are used as described above, it is necessary to set the motor driving system so that ID information is different among the fan motors. That is, when the motor driving system is manufactured, each of the plural fan motors having different ID information is required to be arranged or wired at an appropriate position corresponding to the ID information, and thus the degree of difficulty of the manufacturing work is high. Furthermore, when one of the plural fan motors is exchanged or the like, it is necessary to prepare a fan motor so that ID information coincides before and after the exchange, and thus a load on maintenance of the motor driving system is considerable.

In the configuration described in Japanese Patent Laid-Open No. 2001-286187, it is necessary to add to each fan motor control device a communication line for reading an external signal and recognizing corresponding identification information.

Furthermore, in the configuration described in Japanese Patent No. 6,233,418, in the initial state, enable/disable of the communication of each motor control device with the upper controller is sequentially switched by using one information communication line of the upper controller to allocate identification information. In this configuration, since information has been transmitted to all the motor control devices through one information communication line after allocating the identification information, each motor control device also receives information that is not addressed to itself. In this case, a processing load on information which is not addressed to itself (an overhead on a motor side) becomes tremendous. When the communication speed is increased or the rotational speed of the motor is increased, the motor may not operate properly.

The present disclosure is related to providing a motor driving system in which each of a plurality of motors can efficiently operate regardless of a simple system configuration, a motor driving control device, a control method for a motor driving control device, and a control program for a motor driving control device.

SUMMARY

According to a first aspect of the present disclosure, a motor driving system comprises: a first motor; a first motor driving control device for driving the first motor; a second motor; a second motor driving control device for driving the second motor; a controller for performing communication with the first motor driving control device and the second motor driving control device; a first communication line for connecting a common terminal of the controller and the first motor driving control device; a second communication line for connecting the common terminal and the second motor driving control device; and a switch unit capable of switching each of the first communication line and the second communication line between an enable state in which communication is possible between the controller and the motor driving control device connected to each other by the communication line and an disable state in which communication is impossible between the controller and the motor driving control device under control of the controller, wherein when communicating with the first motor driving control device, the controller controls the switch unit so as to set the first communication line to the enable state and set the second communication line to the disable state, and when communicating with the second motor driving control device, the controller controls the switch unit so as to set the second communication line to the enable state and set the first communication line to the disable state.

Preferably, the controller outputs command information to the first motor driving control device and the second motor driving control device while causing the switch unit to set both the first communication line and the second communication line to the enable state.

Preferably, when receiving predetermined first communication information transmitted from the first motor driving control device, the controller outputs an information sharing instruction to the first motor driving control device while causing the switch unit to set the second communication line to the enable state, and when receiving the information sharing instruction, the first motor driving control device outputs second communication information corresponding to a state of the first motor driving control device.

Preferably, when receiving the second communication information output from the first motor driving control device, the second motor driving control device controls driving of the second motor based on the received second communication information.

Preferably, when receiving the second communication information corresponding to a state in which the first motor driving control device is abnormal, the second motor driving control device increases rotational speed of the second motor by performing rotational speed increasing control.

Preferably, the second motor driving control device reduces rotational speed of the second motor by performing rotational speed reducing control when receiving the second communication information corresponding to a state in which the first motor driving control device is normal after performing the rotational speed increasing control due to reception of the second communication information output from the first motor driving control device.

Preferably, the second communication information contains instruction information for the second motor driving control device which is to receive the second communication information, and the second motor driving control device which has received the second communication information from the first motor driving control device controls driving of the second motor based on the instruction information.

Preferably, when receiving the second communication information output from the first motor driving control device, the controller controls the switch unit to set the second communication line to the enable state and set the first communication line to the disable state, and outputs command information based on the second communication information.

Preferably, the switch unit is configured by using a demultiplexer.

Preferably, the switch unit and the controller are provided on the same circuit board.

According to another aspect of the present disclosure, a motor driving control device for controlling driving of a motor based on a result of communication with an external control device comprises: a first communication unit configured to output predetermined first communication information to a control device; a first reception unit configured to receive an information sharing instruction output from the control device after the first communication unit outputs the first communication information; and a second communication unit configured to output second communication information corresponding to a state of the motor driving control device when the first reception unit receives the information sharing instruction.

Preferably, the motor driving control device further comprises: a second reception unit configured to receive second communication information output from another motor driving control device; and a control unit configured to control driving of the motor based on the received second communication information when the second reception unit receives the second communication information.

According to a further aspect of the present disclosure, a control method for a motor driving control device for controlling driving of a motor based on a result of communication with an external control device comprises: a first communication step of outputting predetermined first communication information to a control device; a first reception step of receiving an information sharing instruction output from the control device after the first communication step outputs the first communication information; and a second communication step of outputting second communication information corresponding to a state of the motor driving control device when the first reception step receives the information sharing instruction.

According to a further aspect of the present disclosure, a non-transitory computer readable medium that stores therein a control program of a motor driving control device for controlling driving of a motor based on a result of communication with an external control device causes a computer to execute: a first communication step of outputting predetermined first communication information to a control device; a first reception step of receiving an information sharing instruction output from the control device after the first communication step outputs the first communication information; and a second communication step of outputting second communication information corresponding to a state of the motor driving control device when the first reception step receives the information sharing instruction.

According to these disclosures, it is possible to provide a motor driving system in which each of a plurality of motors can efficiently operate regardless of a simple system configuration, a motor driving control device, a control method for a motor driving control device, and a control program for a motor driving control device.

DETAILED DESCRIPTION

A configuration of a motor driving system according to an embodiment of the present disclosure will be described hereinafter.

Embodiment

Figure 1:
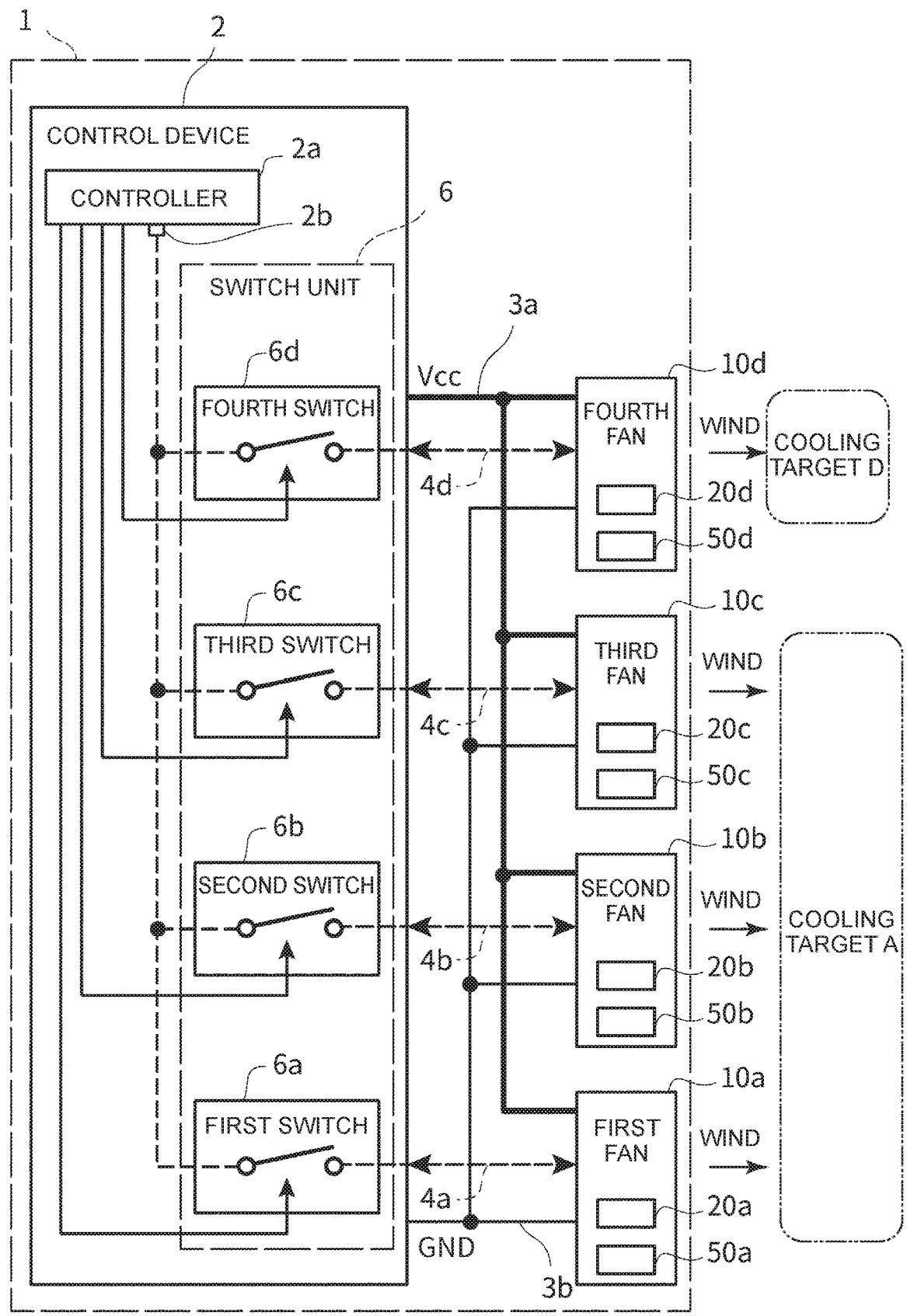
FIG. 1 is a diagram showing a configuration of a motor driving system according to an embodiment of the present disclosure.

FIG. 1 is a diagram showing a configuration of a motor driving system 1 according to an embodiment of the present disclosure.

The motor driving system 1 controls the operation of plural fan motors 10 by one control device 2 to blow air to each of a plurality of cooling targets A and D. Each fan motor 10 includes a motor 20 and a motor driving control device 50 for controlling the driving of the motor 20 (shown in FIG. 2).

As described below, the motor driving system 1 includes at least a first fan 10a, a second fan 10b, and a control device 2 connected to the first fan 10a and the second fan 10b. Specifically, the motor driving system 1 includes a first fan 10a having a first motor 20a and a first motor driving control device 50a for driving the first motor 20a, a second fan 10b having a second motor 20b and a second motor driving control device 50b for driving the second motor 20b, a controller 2a for performing communication with the first motor driving control device 50a and the second motor driving control device 50b, a first communication line 4a for connecting a common terminal 2b of the controller 2a and the first motor driving control device 50a, a second communication line 4b for connecting the common terminal 2b and the second motor driving control device 50b, and a switch unit 6.

Under the control of the controller 2a, with respect to each of the first communication line 4a and the second communication line 4b, the switch unit 6 can switch between an enable state in which communication is possible between the controller 2a and the motor driving control device 50a, 50b which are connected to each other via the communication line 4a, 4b, and an disable state in which communication is impossible between them. When communicating with the first motor driving control device 50a, the controller 2a controls the switch unit 6 so as to set the first communication line 4a to the enable state and set the second communication line 4b to the disable state. Furthermore, when communicating with the second motor driving control device 50b, the controller 2a controls the switch unit 6 so as to set the second communication line 4b to the enable state and set the first communication line 4a to the disable state.

As shown in FIG. 1, in the present embodiment, the motor driving system 1 includes one control device 2 and four fan motors 10 (a first fan 10a, a second fan 10b, a third fan 10c, and a fourth fan 10d).

The first fan 10a includes the first motor 20a and the first motor driving control device 50a for driving the first motor 20a. The second fan 10b includes the second motor 20b and the second motor driving control device 50b for driving the second motor 20b. The third fan 10c includes the third motor 20c and a third motor driving control device 50c for driving the third motor 20c. The fourth fan 10d includes the fourth motor 20d and a fourth motor driving control device 50d for driving the fourth motor 20d.

The first fan 10a, the second fan 10b, and the third fan 10c are fan motors for blowing air to a cooling target A, for example. The fourth fan 10d is a fan motor for blowing air to a cooling target D, for example. That is, the first fan 10a, the second fan 10b, and the third fan 10c are fan motors 10 belonging to the same group directed to the same application. The fourth fan 10d is a fan motor 10 belonging to a different group directed to an application different from that of the first fan 10a and the like. It is to be noted that methods used to direct the plural fan motors to applications is not limited to the foregoing manner.

The first fan 10a, the second fan 10b, and the third fan 10c which are directed to the same application are associated with one other. Information on the association of the fan motors 10 is stored in the controller 2a. The information on the association of the fan motor 10 may be preset in the controller 2a, or may be set by the controller 2a, for example, based on a result of communication performed by each fan motor 10 and the controller 2a.

The four fan motors 10 are connected to the control device 2. In the motor driving system 1, the control device 2 and each fan motor 10 are connected to each other by a high-voltage side power supply line 3a and a low-voltage side power supply line 3b serving as a ground (ground voltage; reference voltage) GND. Each fan motor 10 is enabled to operate by a power supply voltage Vcc applied through the high-voltage side power supply line 3a and the low-voltage side power supply line 3b.

In the present embodiment, the control device 2 includes the controller 2a and the switch unit 6. The controller 2a has a common terminal 2b for communicating with the motor driving control device 50 of each fan motor 10. Furthermore, the controller 2a is connected to the switch unit 6.

The control device 2 is connected to the respective motor driving control devices 50 by plural communication lines 4 (a first communication line 4a, a second communication line 4b, a third communication line 4c, and a fourth communication line 4d), respectively. The control device 2 is communicably connected to the respective motor driving control devices 50 through the communication lines 4. In the present embodiment, the control device 2 and each of the motor driving control devices 50 are configured so as to be capable of performing bidirectional serial communication via one-wire communication line 4.

Each communication line 4 is connected to a common terminal 2b of the controller 2a. The switch unit 6 is provided on the communication lines 4 between the controller 2a and the respective motor driving control devices 50. In the present embodiment, the switch unit 6 includes a first switch 6a, a second switch 6b, a third switch 6c, and a fourth switch 6d that are opened and closed respectively according to a control signal from the controller 2a. The first switch 6a to the fourth switch 6d are constructed by for example, FET (Field Effect Transistor), other transistors, relays, or the like, but they are not limited to these elements.

Specifically, the first communication line 4a connects the controller 2a and the first motor driving control device 50a. The first switch 6a is provided in the middle of the first communication line 4a. The second communication line 4b connects the controller 2a and the second motor driving control device 50b. The second switch 6b is provided in the middle of the second communication line 4b. The third communication line 4c connects the controller 2a and the third motor driving control device 50c. The third switch 6c is provided in the middle of the third communication line 4c. The fourth communication line 4d connects the controller 2a and the fourth motor driving control device 50d. The fourth switch 6d is provided in the middle of the fourth communication line 4d.

Under the control of the controller 2a, with respect to each of the first communication line 4a, the second communication line 4b, the third communication line 4c and the fourth communication line 4d, the switch unit 6 can switch between an enable state in which the communication is possible between the controller 2a and the motor driving control devices 50a, 50b, 50c and 50d which are connected through the communication lines 4a, 4b, 4c and 4d respectively, and an disable state in which communication between them is impossible. By setting each of the first switch 6a to the fourth switch 6d to an off-state, the switch disconnects the corresponding communication line 4 and sets the communication line 4 to the disable state, and by setting each of the first switch 6a to the fourth switch 6d to an on-state, the switch connects the corresponding communication line 4 and sets the communication line 4 to the enable state. The first switch 6a to the fourth switch 6d are connected so that they are not connected in series to each other with respect to the common terminal 2b.

In the present embodiment, the controller 2a is one integrated circuit. The controller 2a and the first switch 6a to the fourth switch 6d of the switch unit 6 are provided on the same circuit board. The communication lines 4 are formed as a conductor pattern on the circuit board. That is, the control device 2 may be configured as one circuit board on which electronic components are mounted.

Figure 2:
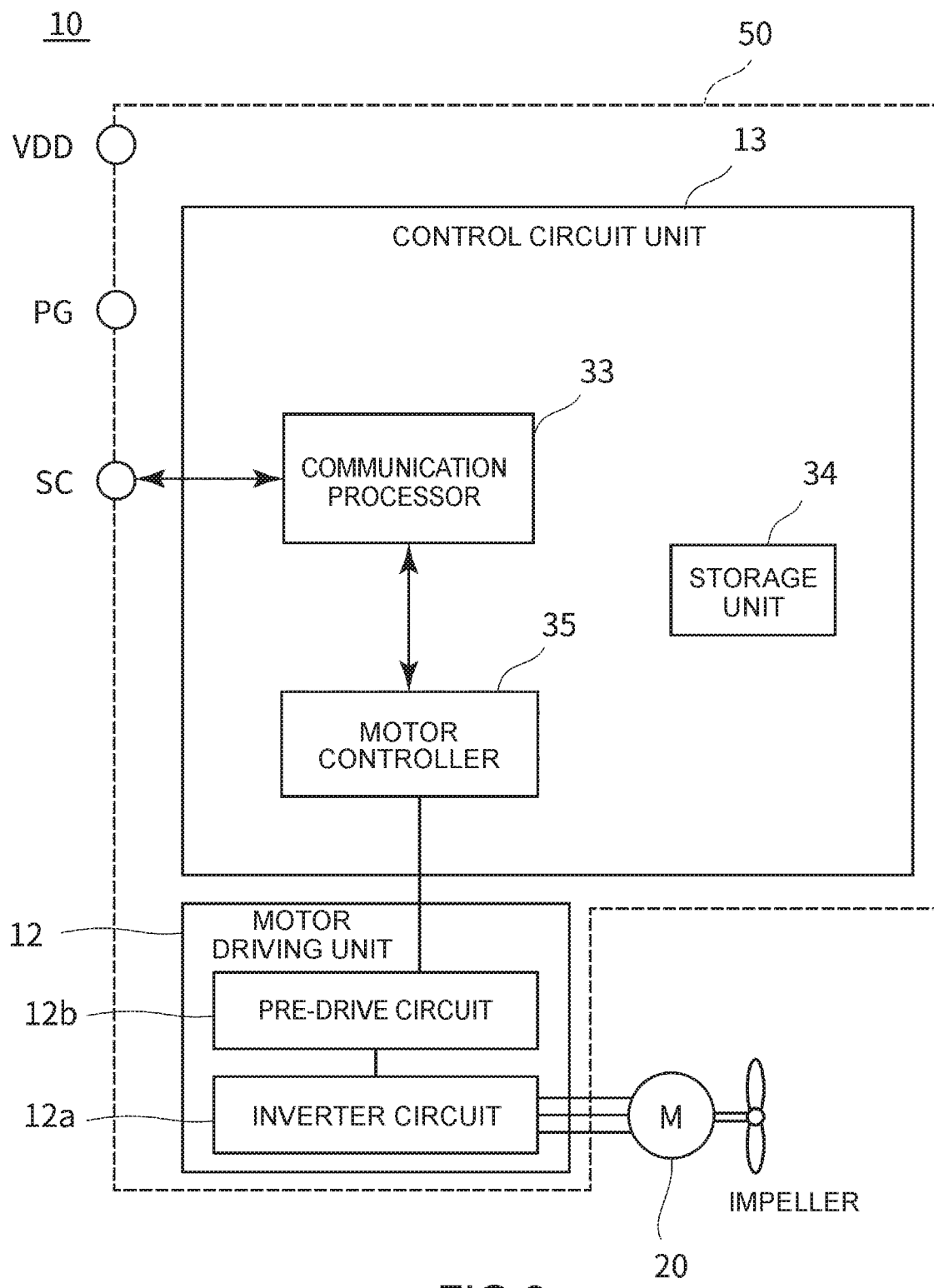
FIG. 2 is a diagram showing a configuration of each fan motor used in the motor driving system.

FIG. 2 is a configuration of each fan motor 10 used in the motor driving system 1.

As shown in FIG. 2, the fan motor 10 includes the motor 20 for rotating an impeller, and the motor driving control device 50 for controlling the driving of the motor 20. The motor driving control device 50 constitutes the motor driving system 1 together with the control device 2, and controls the driving of the motor 20 according to instruction information transmitted from the control device 2.

Specifically, the motor driving control device 50 outputs a drive signal to the motor 20 to control the driving of the motor 20. The motor driving control device 50 rotates the motor 20 by periodically supplying a drive current to an armature coil of the motor 20. In the present embodiment, the motor 20 is, for example, a three-phase brushless motor, but the motor 20 is not limited to this mode. The motor driving control device 50 is used together with a position detector (not shown) for detecting the position of a rotor of the motor 20 such as a Hall IC, but it is not limited to this mode.

In the present embodiment, the motor driving control device 50 has a motor driving unit 12, a control circuit unit 13, and plural terminals. As the plural terminals are provided, for example, a power supply terminal VDD which is connected to the high-voltage side power supply line 3a and to which a power supply voltage Vcc is applied, a ground terminal PG connected to the low-voltage side power supply line 3b, and a communication terminal SC. The components of the motor driving control device 50 shown in FIG. 2 are a part of the whole, and the motor driving control device 50 may have other components in addition to the components shown in FIG. 2.

The motor driving unit 12 includes an inverter circuit 12a and a pre-drive circuit 12b. Based on the drive control signal output from the control circuit unit 13, the motor driving unit 12 outputs a drive signal to the motor 20 to drive the motor 20.

The pre-drive circuit 12b generates an output signal for driving the inverter circuit 12a based on the drive control signal output from the control circuit unit 13, and outputs the output signal to the inverter circuit 12a. The inverter circuit 12a outputs a drive signal to the motor 20 based on the output signal output from the pre-drive circuit 12b to energize three-phase armature coils of the motor 20. The inverter circuit 12a is configured, for example, by arranging a pair of series circuits of two switch elements provided at both ends of a DC power supply for each phase of the armature coils. In each pair of the two switch elements, a terminal of each phase of the motor 20 is connected to a connection point between the switch elements. The pre-drive circuit 12b outputs, as output signals, six kinds of signals corresponding to the respective switch elements of the inverter circuit 12a. By outputting these output signals, the switching element corresponding to each of the output signals is turned on/off, and the drive signal is output to the motor 20 to supply power to each phase of the motor 20.

The control circuit unit 13 is constituted by, for example, a microcomputer, a digital circuit or the like. The control circuit unit 13 is connected to plural terminals (a power supply terminal VDD, a ground terminal PG, and a communication terminal SC). The control circuit unit 13 includes a communication processor 33, a storage unit 34, and a motor controller 35. The control circuit unit 13 outputs a drive control signal to the motor driving unit 12 based on a position signal input from the position detector to control the operation of the motor driving unit 12.

The communication processor 33 is connected to the communication terminal SC to control communication between the motor driving control device 50 and the controller 2a of the control device 2. The communication terminal SC is connected to the communication line 4. The communication terminal SC is a terminal to which instruction information transmitted from the control device 2 and other information transmitted via the communication line 4 is input. Furthermore, the communication terminal SC is a terminal from which information such as response information to the control device 2, etc. is output from the motor driving control device 50.

Incidentally, the instruction information includes, for example, information on the driving of the motor 20. The information on the driving of the motor 20 is, for example, information used for controlling the rotational speed of the motor 20, such as rotational speed command information corresponding to a target rotational speed of the motor 20.

Furthermore, information on the driving of the motor 20 is information for instructing to drive or stop the motor 20. In addition, information on the driving of the motor 20 is information for instructing to output information on the current rotational speed of the motor 20, and the like. In the present embodiment, when instruction information is transmitted from the controller 2a to a specific motor driving control device 50, the control of the switch unit 6 is performed by the controller 2a as described later. Therefore, the instruction information does not contain designation information for designating a motor driving control device 50 as a target which is caused to perform a control operation (for example, identification information of the motor driving control device 50 as a target which is caused to perform the control operation).

In the present embodiment, when information such as instruction information is output from the controller 2a, the information is input to the communication terminal SC of the motor driving control device 50 to which the communication line 4 under the enable state is connected. The communication processor 33 of the motor driving control device 50 receives the input information. For example, when instruction information is input, the communication processor 33 receives the instruction information and transmits information on the driving of the motor 20 to the motor controller 35.

The storage unit 34 is configured by using, for example, a ROM (read only memory), a RAM (random access memory), or the like. In the storage unit 34 are stored self-diagnosis information generated by self-diagnosing the operation state of the motor driving control device 50 by the control circuit unit 13, information on the control operation of the motor 20, operation parameters (for example, an advance angle value, etc.) which are preset and used for the control operation of the motor 20, etc. In the storage unit 34 may be stored a control program of the motor driving control device 50, etc. which is to be executed in the control circuit unit 13.

The control circuit unit 13 can perform various operations based on the information stored in the storage unit 34. For example, when the advance angle value is stored as the operation parameter in the storage unit 34, the motor controller 35 can output the drive control signal based on the advance angle value. As a result, it is possible to adjust energization timing of the coils of the motor 20.

The motor controller 35 outputs the drive control signal to the motor driving unit 12 based on instruction information acquired by the communication processor 33, information on the rotational position of the motor 20 (for example, a position signal obtained by the position detector or the like), and information stored in the storage unit 34. The drive control signal is, for example, a PWM signal having a duty ratio corresponding to a torque for rotating the motor 20. For example, the motor controller 35 outputs a drive control signal having a duty ratio which is adjusted so that the actual rotational speed of the motor 20 which is determined based on the position information is coincident with a target rotational speed. The drive control signal is output at an appropriate interval corresponding to the rotational position of the motor 20 for each phase of the motor 20.

In the present embodiment, the motor driving control device 50 is packaged as a single integrated circuit. That is, the motor driving unit 12 and the control circuit unit 13 are configured as a single integrated circuit. The integrated circuit has plural terminals such as the power supply terminal VDD, the communication terminal SC, the ground terminal PG, and the like. Furthermore, for example, a part of the motor driving control device 50 such as only the control circuit unit 13 may be packaged as a single integrated circuit. Furthermore, the whole or a part of the motor driving control device 50 may be packaged together with another device to constitute a single integrated circuit.

Figure 3:
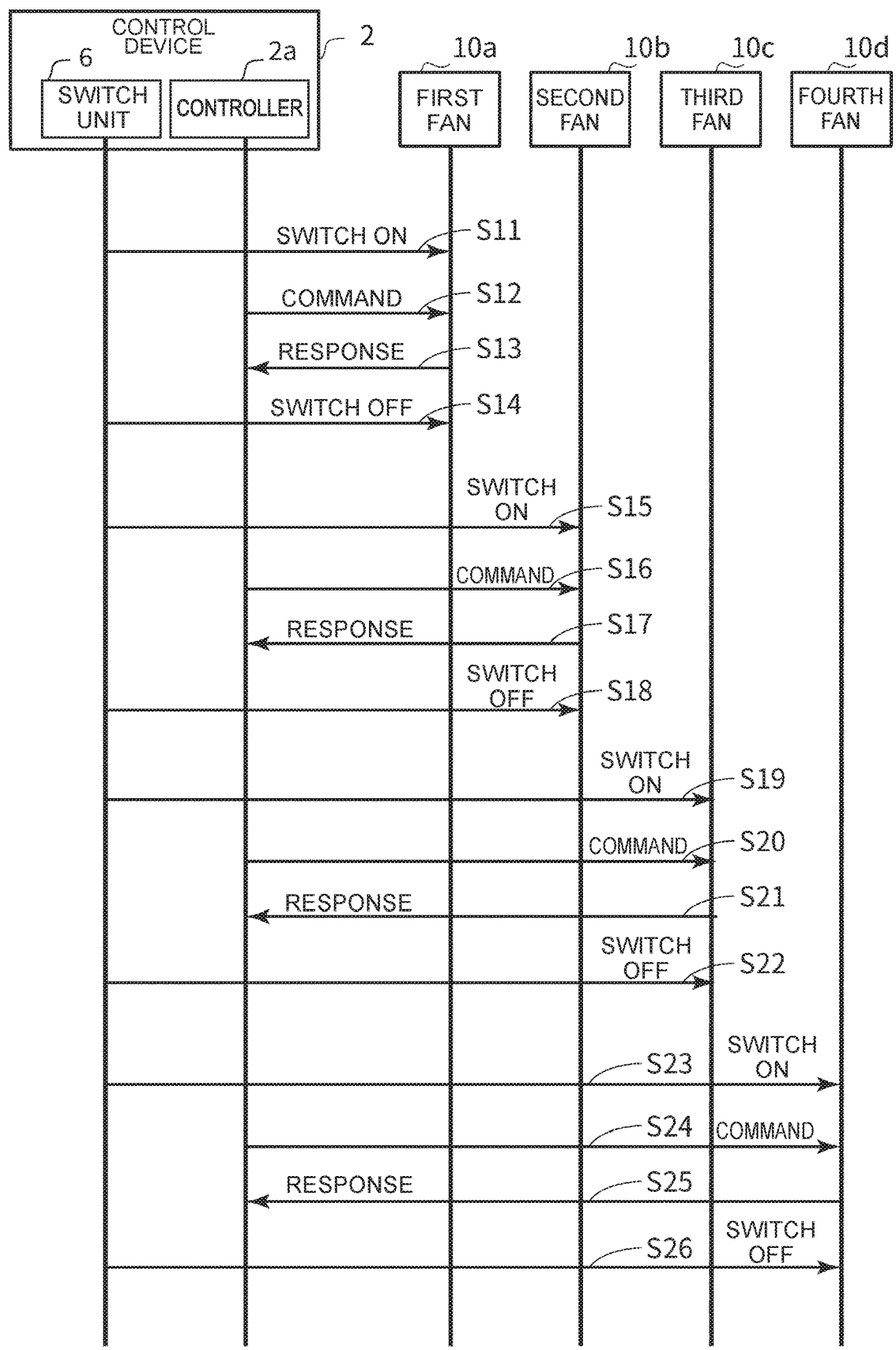
FIG. 3 is a diagram showing an example of a communication sequence between a control device and a motor driving control device of each fan motor.

FIG. 3 is a diagram showing an example of a communication sequence between the control device 2 and the motor driving control device 50 of each of the fan motors 10 (the first fan 10a to the fourth fan 10d).

In FIG. 3 and the figures subsequent to FIG. 3 and the description of these figures, "switch ON" may be used to show that the switch unit 6 sets the communication line 4 to the enable state under the control of the controller 2a, and "switch OFF" may be used to show that the switch unit 6 sets the communication line 4 to the disable state under the control of the controller 2a. Furthermore, in the figures, execution of the switch ON is indicated by an arrow extending from the switch unit 6 to the fan motor 10 which is enabled to communicate with the controller 2a, and execution of the switch OFF is indicated by an arrow extending from the switch unit 6 to the fan motor 10 which is disabled to communicate with the controller 2a. For example, the setting of the first communication line 4a to the enable state is indicated by an arrow extending from the switch unit 6 to the first fan motor 10.

In the present embodiment, when communicating with the first motor driving control device 50a of the first fan 10a, the controller 2a controls the switch unit 6 so as to set the first communication line 4a to the enable state and set the other communication lines (the second communication line 4b, the third communication line 4c, the fourth communication line 4d) to the disable state. That is, the controller 2a sets the first switch 6a to the ON-state, and sets the second switch 6b, the third switch 6c, and the fourth switch 6d to the OFF-state. Under this state, the controller 2a communicates with the first motor driving control device 50a. When communicating with each of the motor driving control devices 50b, 50c, and 50d of the other fan motors 10 (the second fan 10b to the fourth fan 10d), the controller 2a likewise sets only the corresponding one of the communication lines 4 to the enable state.

An operation in which the controller 2a communicates with the first motor driving control device 50a of the first fan 10a (from step S11 to step S14), an operation in which the controller 2a communicates with the second motor driving control device 50b of the second fan 10b (from step S15 to step S18), an operation in which the controller 2a communicates with the third motor driving control device 50c of the third fan 10c (from step S19 to step S22), and an operation in which the controller 2a communicates with the fourth motor driving control device 50d of the fourth fan 10d (from step S23 to step S26) are successively shown in FIG. 3.

When the controller 2a communicates with the first motor driving control device 50a, the following operation is performed. That is, the controller 2a sets the first switch 6a to the ON-state (step S11). At this time, the other switches (the second switch 6b, the third switch 6c, the fourth switch 6d) are set to the OFF-state. When the controller 2a outputs information (for example, a command (command information) or the like) under these states, the output information is transmitted via the first communication line 4a under the enable state to the first motor driving control device 50a (step S12). When the first motor driving control device 50a receiving the information outputs response information containing a response to the received information, the output response information is transmitted to the controller 2a via the first communication line 4a (step S13). Upon receiving the response information, the controller 2a sets the first switch 6a to the OFF-state (step S14). As a result, the communication between the controller 2a and the first motor driving control device 50a is performed. When continuously communicating with the first motor driving control device 50a, the controller 2a may not perform the processing of setting the first switch 6a to the OFF-state.

The operation is also performed in the similar manner when the controller 2a communicates with the motor driving control devices 50b, 50c, 50d of the other fan motors 10 (from the second fan 10b to the fourth fan 10d).

That is, when communicating with the second motor driving control device 50b, the controller 2a sets the second switch 6b to the ON-state (step S15). At this time, the other switches (the first switch 6a, the third switch 6c, the fourth switch 6d) are set to the OFF-state. When the controller 2a outputs information under these states, the output information is transmitted to the second motor driving control device 50b via the second communication line 4b under the enable state (step S16). When the second motor driving control device 50b receiving the information outputs response information, the output response information is transmitted to the controller 2a (step S17). Upon receiving the response information, the controller 2a sets the second switch 6b to the OFF-state (step S18).

When communicating with the third motor driving control device 50c, the controller 2a sets the third switch 6c to the ON-state (step S19). At this time, the other switches (the first switch 6a, the second switch 6b, the fourth switch 6d) are set to the OFF-state. When the controller 2a outputs information under these states, the output information is transmitted to the third motor driving control device 50c via the third communication line 4c under the enable state (step S20). When the third motor driving control device 50c receiving the information outputs response information, the output response information is transmitted to the controller 2a (step S21). Upon receiving the response information, the controller 2a sets the third switch 6c to the OFF-state (step S22).

When communicating with the fourth motor driving control device 50d, the controller 2a sets the fourth switch 6d to the ON-state (step S23). At this time, the other switches (the first switch 6a, the second switch 6b, and the third switch 6c) are set to the OFF-state. When the controller 2a outputs information under these states, the output information is transmitted to the fourth motor driving control device 50d via the fourth communication line 4d under the enable state (step S24). When the fourth motor driving control device 50d receiving the information outputs response information, the output response information is transmitted to the controller 2a (step S25). Upon receiving the response information, the controller 2a sets the fourth switch 6d to the OFF-state (step S26).

As described above, the controller 2a controls the operation of the switch unit 6 so as to set only the communication line 4 corresponding to a communication target to the enable state, in which the communication can be appropriately performed without needing to include information designating the communication target into the information to be output.

The controller 2a is configured so as to periodically switch the communication line 4 which is set to the enable state, and communicate with each fan motor 10 during the operation of the motor driving system 1, thereby grasping the operation state of each fan motor 10. However, the controller 2a is not limited to this configuration.

The number of the communication lines 4 to be set to the enable state is not limited to one. By simultaneously setting two or more communication lines 4 to the enable state and the other communication lines 4 to the disable state, the controller 2a can simultaneously transmit information to two or more motor driving control devices corresponding to the communication lines 4 which are set to the enable state.

Specifically, for example, the controller 2a can output the command information to the first motor driving control device 50a and the second motor driving control device 50b while the controller 2a causes the switch unit 6 to set both the first communication line 4a and the second communication line 4b to the enable state. At this time, both the third communication line 4c and the fourth communication line 4d are set to the disable state, whereby the command information can be prevented from being received by the third motor driving control device 50c or the fourth motor driving control device 50d.

Figure 4:
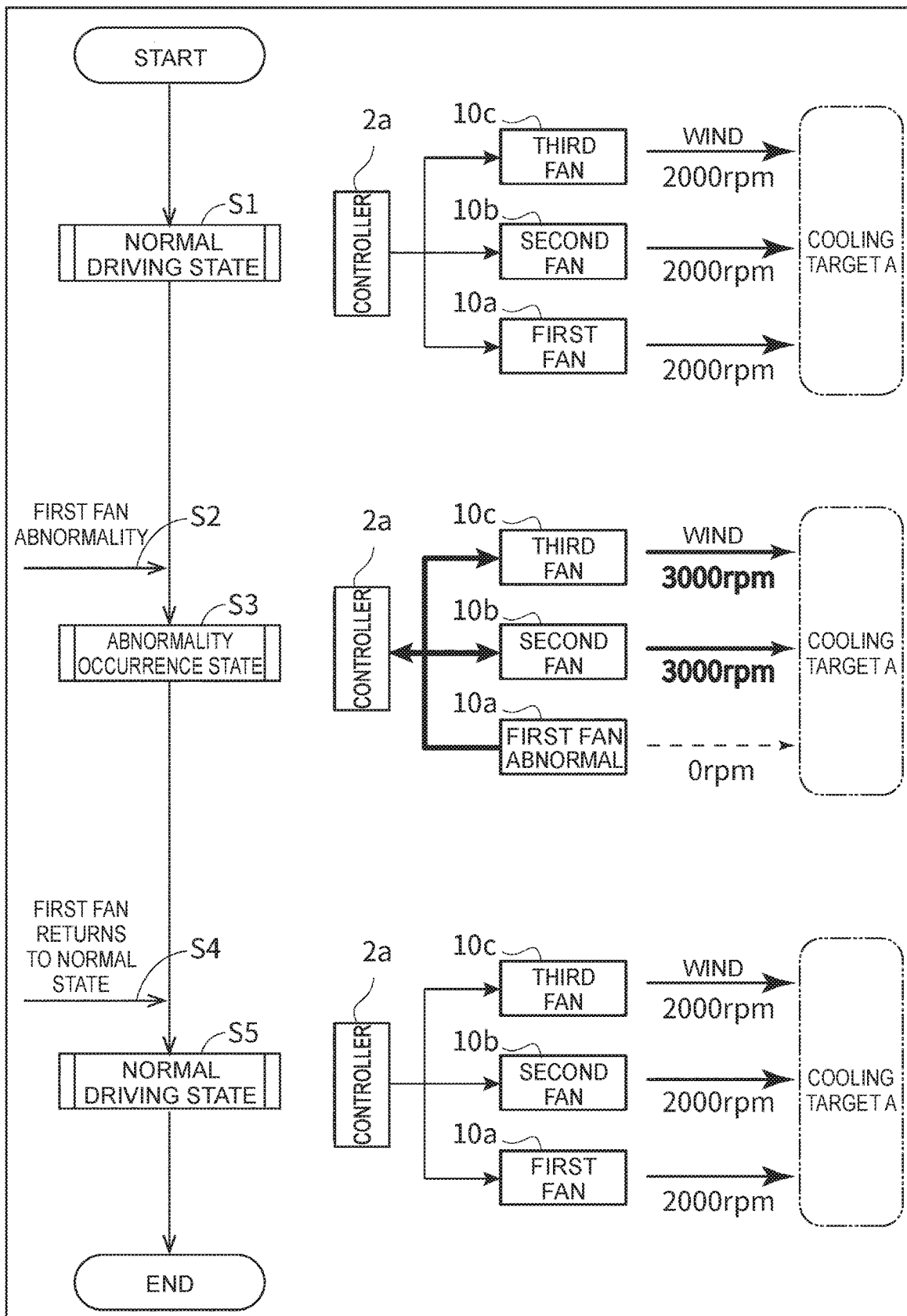
FIG. 4 is a diagram showing a rough flow of a cooperative operation.

FIG. 4 is a diagram showing a rough flow of a cooperative operation performed by the motor driving system 1.

The motor driving system 1 can perform a cooperative operation. In the cooperative operation, for example, when one fan motor 10 falls into an abnormal state within a group of fan motors 10 associated as being directed to the same application, the other fan motors 10 are caused to execute an operation different from a normal operation. Hereinafter, this operation to be performed by individual fan motors will be also referred to as "an operation under cooperation"

Here, the abnormal state means, for example, a state in which the rotation of the motor 20 is hindered due to existence of foreign matter and this is detected by the motor driving control device 50. In addition to such a state, for example, a state in which the temperature increases or current does not flow through the coils of the motor 20, which is detected by the motor driving control device 50 or the like may be an abnormal state.

In the present embodiment, as described above, the first fan 10a, the second fan 10b, and the third fan 10c are associated with one other as blowing air to the same cooling target A. That is, the first fan 10a, the second fan 10b, and the third fan 10c are associated so as to be capable of cooperating with one another.

In FIG. 4, in order to simplify the description, components related to the cooperative operation are shown in a simplified manner. An arrow between the controller 2a and each of the first fan 10a, the second fan 10b, and the third fan 10c schematically indicates that information is transmitted by communication. The communication between the controller 2a and each of the first fan 10a, the second fan 10b, and the third fan 10c can be performed by controlling the switch unit 6 for each target with which the communication is performed as described above.

A rough flow of the cooperative operation performed by the motor driving system 1 is as follows, for example.

That is, in step S1, in the case of a normal operation state in which all the fan motors 10 are normally operated, all three of the fans 10a, 10b, and 10c blow air to a cooling target A. A case in which each of the fans 10a, 10b, and 10c rotates the motor 20 at 2000 rpm and blows air under the above state is assumed.

In step S2, when an abnormality occurs in the first fan 10a, for example, air blowing stops, the motor driving system 1 falls into an abnormality occurring state (step S3). Then, the first fan 10a and the controller 2a communicate with each other, whereby the controller 2a controls the switch unit 6 so that information output from the first fan 10a is input to the other fans (the second fan 10b and the third fan 10*c*). The first fan 10*a* outputs communication information corresponding to an abnormal state to the second fan 10*b* and the third fan 10*c* which are associated with each other.

When communication information from the first fan that has fallen into the abnormal state as described above is input, each of the second fan 10*b* and the third fan 10*c* performs an operation under cooperation. For example, each of the second motor 20*b* of the second fan 10*b* and the third motor 20*c* of the third fan 10*c* is driven to rotate at 3000 rpm so as to compensate for a lacking amount of air which is due to no air blowing from the first fan 10*a*. As a result, it is possible to ensure the amount of air to be blown to the cooling target A.

Thereafter, when the first fan 10*a* in which abnormality has occurred returns to the normal state in step S4, the motor driving system 1 is set to the normal operation state again (step S5). Then, the first fan 10*a* and the controller 2*a* communicate with each other, whereby the controller 2*a* controls the switch unit 6 so that information output from the first fan 10*a* is input to the other fans (the second fan 10*b* and the third fan 10*c*). The first fan 10*a* outputs the communication information corresponding to the normal state to the second fan 10*b* and the third fan 10*c* which are associated with each other.

When the communication information from the first fan that has returned to the normal state is input as described above, each of the second fan 10*b* and the third fan 10*c* returns to an operation under the normal state. For example, the second motor 20*b* and the third motor 20*c* are rotated at 2000 rpm before shifting to the operation under cooperation, thereby blowing air to the cooling target A together with the first fan 10*a*.

In the present embodiment, the operation under cooperation as described above, the operation of returning to the operation under the normal state, etc. are performed under the control of the motor driving control device 50 of each fan motor 10. It is to be noted that each fan motor 10 is not limited to one which autonomously performs the operation under cooperation or returns to the operation under the normal state as described above. For example, execution of the operation under cooperation, the operation of returning to the operation under the normal state, etc. may be triggered by each motor driving control device 50 operating according to the control of the controller 2*a*.

A specific example of the cooperative operation performed by the motor driving system 1 will be described hereinafter.

In the present embodiment, each motor driving control device 50 has the following configuration. That is, the motor driving control device 50 outputs an information sharing request (an example of predetermined first communication information) to the control device 2 (first communication step). Furthermore, after outputting the first communication information, the motor driving control device 50 receives an information sharing instruction output from the control device 2 (first reception step). Then, when receiving the information sharing instruction, the motor driving control device 50 outputs cooperation information (an example of second communication information) corresponding to the state of the motor driving control device 50 (second communication step). These operations are performed by the communication processor 33 functioning as a first communication unit, a first reception unit, and a second communication unit.

The information sharing request is output from the motor driving control device 50, for example, when a fan motor 10 falls from the normal state into the abnormal state and when a fan motor 10 returns from the abnormal state to the normal state.

Furthermore, the communication processor 33 functions as a second reception unit configured for receiving the cooperation information output from the other motor driving control devices 50. When the communication processor 33 receives the cooperation information, the motor controller 35 functions as a control unit configured for controlling the driving of the motor 20 based on the received cooperation information.

Since each motor driving control device 50 is configured as described above, the communication, etc. are performed under the cooperative operation as described hereinafter. That is, the motor driving control device 50 of a fan motor 10 in which abnormality has occurred (for example, the first motor driving control device 50*a*) outputs the information sharing request in order to transmit information to the other cooperation-enabled motor driving control devices 50 (for example, the second motor driving control device 50*b* and the third motor driving control device 50*c*). When receiving the information sharing request transmitted from the first motor driving control device 50*a*, the controller 2*a* outputs the information sharing instruction to the first motor driving control device 50*a* while causing the switch unit 6 to set the second communication line 4*b* and the third communication line 4*c* to the enable state. When receiving the information sharing instruction, the first motor driving control device 50*a* outputs the cooperation information corresponding to the state of the first motor driving control device 50*a*.

At this time, the information sharing instruction is also input to the second motor driving control device 50*b* and the third motor driving control device 50*c*. These motor driving control devices 50*b* and 50*c* may ignore the information sharing instruction. That is, only the first motor driving control device 50*a* which has output the information sharing request immediately before may receive the information sharing instruction as a target to which the information sharing instruction is addressed.

When the first motor driving control device 50*a* outputs the cooperation information, the cooperation information is input to the second motor driving control device 50*b*, the third motor driving control device 50*b* and the controller 2*a* via the communication lines 4*a*, 4*b*, and 4*c* under the enable state. When receiving the cooperation information output from the first motor driving control device 50*a*, the second motor driving control device 50*b* and the third motor driving control device 50*c* control the driving of the second motor 20*b* and the third motor 20*c* based on the received cooperation information.

In the foregoing case, more specifically, when receiving cooperation information corresponding to a state in which the first motor driving control device 50*a* is abnormal, each of the second motor driving control device 50*b* and the third motor driving control device 50*c* increases the rotational speed of the second motor 20*b* or the third motor 20*c* by performing rotational speed increasing control (an example of the operation under cooperation).

It is to be noted that the second motor driving control device 50*b* and the third motor driving control device 50*c* reduce the rotational speeds of the second motor 20*b* and the third motor 20*c* by performing rotational speed reducing control, when receiving cooperation information corresponding to a state in which the first motor driving control device 50*a* is normal after performing the rotational speed increasing control upon reception of the cooperation information output from the first motor driving control device 50a as described above (an example of the operation of returning to the driving state under the normal state).

Here, when receiving the cooperation information output from the first motor driving control device 50a, the controller 2a may control the switch unit 6 so as to set the second communication line 4b and the third communication line 4c to the enable state and set the first communication line 4a to the disable state, and output command information based on the cooperation information.

It is to be noted that such a cooperative operation may be performed in the case in which at least the first motor driving control device 50a and the second motor driving control device 50b are associated with each other (that is, when the first fan 10a and the second fan 10b are associated with each other). That is, in this case, when the controller 2a receives the information sharing request transmitted from the first motor driving control device 50a in which abnormality has occurred, the controller 2a outputs the information sharing instruction to the first motor driving control device 50a while causing the switch unit 6 to set the second communication line 4b to the enable state. As a result, the second motor driving control device 50b can be caused to perform the operation under cooperation.

In this case, when receiving the cooperation information output from the first motor driving control device 50a, the second motor driving control device 50b may control the driving of the second motor 20b based on the received cooperation information. More specifically, the second motor driving control device 50b increases the rotational speed of the second motor 20b by performing rotational speed increasing control, when receiving the cooperation information corresponding to the state in which the first motor driving control device 50a is abnormal. Furthermore, the second motor driving control device 50b reduces the rotational speed of the second motor 20b by performing rotational speed reducing control, when receiving the cooperation information corresponding to a state in which the first motor driving control device 50a is normal after performing the rotational speed increasing control upon reception of the cooperation information output from the first motor driving control device 50a. Furthermore, when the controller 2a receives the cooperation information output from the first motor driving control device 50a, the controller 2a may control the switch unit 6 to set the second communication line 4b to the enable state and set the first communication line 4a to the disable state, and output command information based on the cooperation information.

Figure 5:
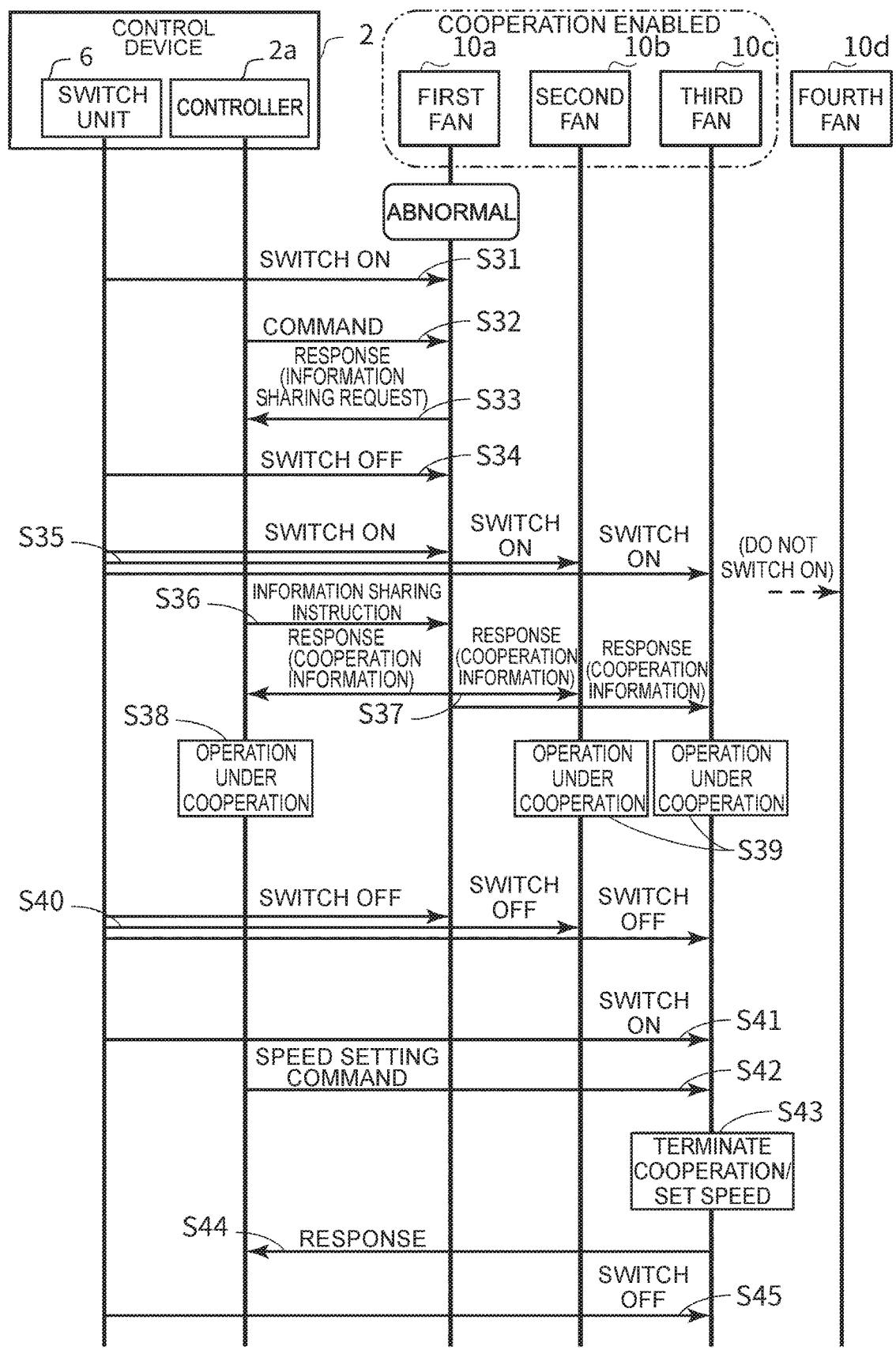
FIG. 5 is a diagram showing an example of a communication sequence between the control device and the motor driving control device of each fan motor when abnormality occurs in a first fan.

FIG. 5 is a diagram showing an example of a communication sequence between the control device 2 and the motor driving control device 50 of each fan motor 10 when abnormality occurs in the first fan 10a.

A state in which the first fan 10a has fallen into an abnormal state as shown in FIG. 5 is assumed.

At this time, the controller 2a sets the first switch 6a to the ON-state to set the first communication line 4a to the enable state, and outputs a command, which the first motor driving control device 50a of the first fan 10a receives (steps S31 and S32). Since the first motor driving control device 50a is in the abnormal state, the first motor driving control device 50a outputs an information sharing request (an example of predetermined first communication information) as response information to the received command (step S33). Upon receiving the response information, the controller 2a sets the first switch 6a to the OFF-state to set the first communication line 4a to the disable state (step S34). When determining that the received response information is an information sharing request, the controller 2a may keep the first communication line 4a in the enable state.

Here, when determining that the received response information is an information sharing request, the controller 2a performs the following operation. That is, the second communication line 4b and the third communication line 4c corresponding to the second fan 10b and the third fan 10c associated with the first fan 10a which has output the information sharing request are set to the enable state (step S35). At this time, the fourth communication line 4d corresponding to the fourth fan 10d unassociated with the first fan 10a which has output the information sharing request is not set to the enable state.

Then, the controller 2a outputs an information sharing instruction (step S36). As a result, among the motor driving control devices 50a, 50b, and 50c which are enabled to communicate with the controller 2a, the first motor driving control device 50a that has output the information sharing request receives the information sharing instruction.

Upon receiving the information sharing instruction, the first motor driving control device 50a outputs cooperation information (an example of the second communication information) as response information (step S37). The cooperation information includes information indicating that the first motor driving control device 50a is in the abnormal state. That is, the cooperation information is information corresponding to the state of the first motor driving control device 50a. At this time, the cooperation information is input to and received by the controller 2a, the second motor driving control device 50b, and the third motor driving control device 50c via the communication lines 4a, 4b, and 4c under the enable state.

Upon reception of the cooperation information, the controller 2a performs the operation under cooperation based on the cooperation information (step S38). The operation under cooperation performed by the controller 2a is, for example, an operation of determining that the first fan 10a is in the abnormal state, and performing communication with each fan motor 10 on the premise that the first fan 10 a is in the abnormal state.

On the other hand, when receiving the cooperation information, each of the second motor driving control device 50b and the third motor driving control device 50c performs the operation under cooperation based on the cooperation information (step S39). Here, the cooperation information includes information indicating that the first motor driving control device 50a is in the abnormal state. Therefore, each of the motor driving control devices 50b and 50c performs the rotational speed increasing control as the operation under cooperation. As a result, the rotational speed of the second motor 20b and the rotational speed of the third motor 20c increase. At this time, the motor driving control devices 50b and 50c store past rotation speeds.

When performing the operation under cooperation, the controller 2a sets the first switch 6a, the second switch 6b, and the third switch 6c to the OFF-state, and sets the communication lines under the enable state (the first communication line 4a, the second communication line 4b, and third communication line 4c) to the disable state (step S40).

Under a state in which the first fan 10a has fallen into the abnormal state and the operation under cooperation is being performed on the second fan 10b and the third fan 10c associated with the first fan 10a, the controller 2a may communicate with the second fan 10b and the third fan 10c on which the operation under cooperation is being performed, and drive the second fan 10b and the third fan 10c under the control of the controller 2a.

For example, when the controller 2a performs the operation of controlling the rotational speed of the third fan 10c after the processing of the step S40 described above is executed, the following operation is performed. That is, the controller 2a sets the third communication line 4c to the enable state (step S41), and then outputs a speed setting command as command information. In this case, the speed setting command is received by the third motor driving control device 50c (step S42).

When receiving the speed setting command related to the driving content of the third motor 20c as described above, the third motor driving control device 50c terminates the operation under cooperation that has been carried out up until that point in time, and controls the third motor 20c so that the third motor 20c is driven at the rotational speed corresponding to the received speed setting command (step S43). When the control corresponding to the speed setting command as described above is performed, response information indicating this fact is output (step S44). Upon receiving the response information, the controller 2a sets the third communication line 4c to the disable state (step S45).

As described above, when command information from the controller 2a which is related to the driving content of the motor is transmitted, the motor driving control device 50 which is performing the operation under cooperation terminates the operation under cooperation, and drives the motor based on the command information. Accordingly, the motor 20 which is rotating in connection with the operation under cooperation can be driven by the controller 2a at a rotational speed which better conforms to the situation.

Figure 6:
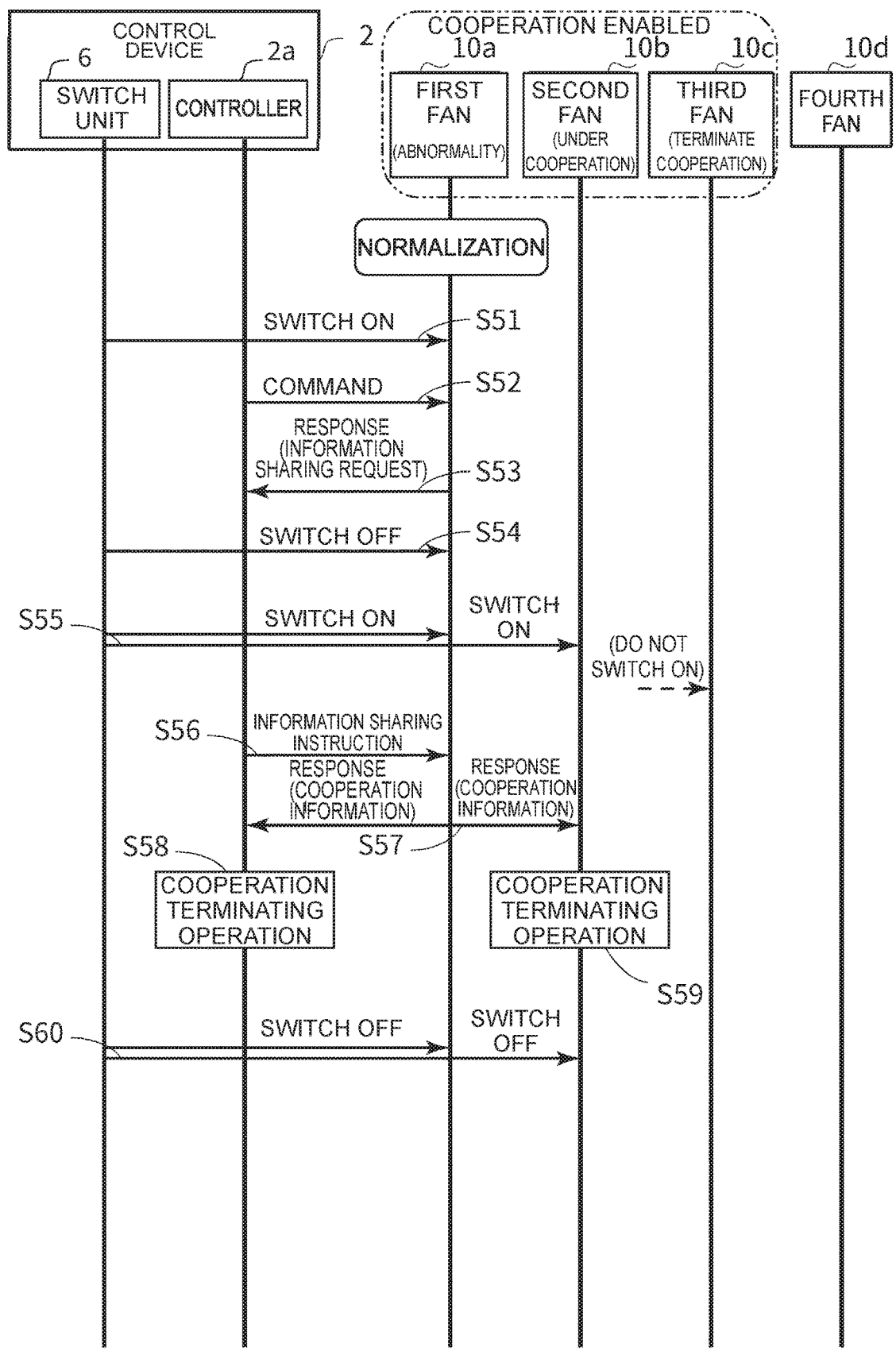
FIG. 6 is a diagram showing an example of a communication sequence between the control device and the motor driving control device of each fan motor when the first fan returns to a normal state after falling into an abnormal state.

FIG. 6 is a diagram showing an example of a communication sequence between the control device 2 and the motor driving control device 50 of each fan motor 10 in the case in which the first fan 10a returns to the normal state after the first fan 10a has fallen into the abnormal state.

FIG. 6 shows an example of an operation after the operation of FIG. 5 is performed.

A case in which the first fan 10a under the abnormal state returns to the normal state is assumed.

At this time, when the controller 2a sets the first switch 6a to the ON-state to set the first communication line 4a to the enable state and outputs a command, the first motor driving control device 50a of the first fan 10a receives the command (steps S51 and S52). Since the first motor driving control device 50a has returned from the abnormal state to the normal state, the first motor driving control device 50a outputs an information sharing request (an example of the predetermined first communication information) as response information for the received command (step S53). Upon reception of the response information, the controller 2a sets the first switch 6a to the OFF-state to set the first communication line 4a to the disable state (step S54). When determining that the received response information is an information sharing request, the controller 2a can keep the first communication line 4a in the enable state.

Here, when determining that the received response information is an information sharing request, the controller 2a performs the following operation. That is, as in the case of the step S35 of FIG. 5, the controller 2a sets, to the enable state, the communication line 4 corresponding to the fan motor 10 associated with the first fan 10a which has output the information sharing request (step S55). However, when the controller 2a receives the information sharing request from the first fan 10a in the case in which the controller 2a performs the operation under cooperation because the first fan 10a is in the abnormal state, for a fan motor 10 which has transmitted the speed setting command after performing the operation under cooperation, the controller 2a still keeps the communication line 4 corresponding to the fan motor 10 in the disable state. That is, in this case, since the controller 2a has transmitted the speed setting command to the third fan 10c after performing the operation under cooperation, the controller 2a still keeps the third communication line 4c corresponding to the third fan 10c in the disable state, and does not set the third communication line 4c to the enable state. Also, the fourth communication line 4d corresponding to the fourth fan 10d unassociated with the first fan 10a which has output the information sharing request is not set to the enable state. Therefore, the controller 2a sets the first communication line 4a and the second communication line 4b corresponding to the first fan 10a and the second fan 10b to the enable state.

Then, the controller 2a outputs an information sharing instruction (step S56). As a result, among the motor driving control devices 50a and 50b which are enabled to communicate with the controller 2a, the first motor driving control device 50a that has output the information sharing request receives an information sharing instruction.

Upon reception of the information sharing instruction, the first motor driving control device 50a outputs cooperation information (an example of the second communication information) as response information (step S57). The cooperation information includes information indicating that the first motor driving control device 50a is in the normal state. That is, the cooperation information is information corresponding to the state of the first motor driving control device 50a. The cooperation information is input to and received by the controller 2a and the second motor driving control device 50b via the communication lines 4a and 4b under the enable state at this point in time.

Upon reception of the cooperation information including the information indicating that the first motor driving control device 50a is in the normal state, the controller 2a performs a cooperation terminating operation based on the cooperation information (step 58). The cooperation terminating operation is, for example, the control for terminating the operation under cooperation. That is, the controller 2a thereafter performs the control under the normal state.

On the other hand, when receiving the cooperation information including the information indicating that the first motor driving control device 50a is in the normal state, the second motor driving control device 50b performs the cooperation terminating operation based on the cooperation information (step S59). That is, the cooperation information includes the information indicating that the first motor driving control device 50a is in the normal state. Therefore, the second motor driving control device 50b performs the rotational speed reducing control as the cooperation terminating operation. As a result, the rotational speed of the second motor 20b decreases. It is to be noted that the reduced rotational speed may be set to rotational speed before execution of the operation under cooperation, which is stored when the operation under cooperation is performed, but the reduced rotational speed is not limited to this rotational speed.

When performing the cooperation terminating operation, the controller 2a sets the first switch 6a and the second switch 6b to the OFF-state, and sets the communication lines under the enable state (the first communication line 4a and the second communication line 4b) to the disable state (step S60).

In the case in which the first fan 10a returns to the normal state as described above, the controller 2a may communicate with the second fan 10b associated with the first fan 10a to drive the second fan 10b under the control of the controller 2a when the operation under cooperation is being performed on the second fan 10b. For example, under the control of the controller 2a, the rotational speed of the second motor 20b of the second fan 10b may be reduced so that the second fan 10b is returned from the state in which the operation under cooperation is performed.

As described above, in the present embodiment, the motor driving system 1 includes the plural motors 20, the plural motor driving control devices 50 for driving the plural motors 20 respectively, the controller 2a for communicating with the motor driving control devices 50, the plural communication lines 4 for connecting a common terminal 2b of the controller 2a and each of the plural motor driving control devices 50, and the switch unit 6 capable of switching the plural communication lines 4 between the enable state in which the controller 2a and the motor driving control device 50 can communicate with each other and the disable state in which the controller 2a and the motor driving control device 50 cannot communicate with each other under the control of the controller 2a. When communicating with a specific motor driving control device 50 of the plural motor driving control devices 50, the controller 2a controls the switch unit 6 to set the communication line 4 for connecting the specific motor driving control device 50 and the controller 2a to the enable state, and set the other communication lines 4 to the disable state.

Since the motor driving system 1 has the aforementioned configuration, setting of identification information for identifying each motor driving control device 50 is unnecessary for the motor driving system 1. A workload for setting the identification information (time, labor of processing, etc.) are unnecessary, and also it is unnecessary to provide a specific signal line or the like for making a setting signal for setting flow through the motor driving system 1. Furthermore, the controller 2a does not need to include the identification information in information to be output from the controller 2a. Therefore, the amount of information to be communicated can be saved, and the information can be promptly transmitted and received. In addition, since the motor driving control device 50 is not supplied with command information other than command information addressed to itself, the processing load of the motor driving control device 50 can be reduced, and an overload state can be suppressed. Therefore, occurrence of an abnormal operation caused by the overload state can be prevented.

Accordingly, it is possible to construct the motor driving system 1 capable of efficiently operating each of the plural motors 20 in spite of a simple system configuration.

Under a state in which causing the switch unit 6 to set two or more communication lines 4 to the enable state, the controller 2a can output command information to two or more motor driving control devices 50 connected to the communication lines 4 under the enable state. Accordingly, the command information can be efficiently transmitted to the plural motor driving control devices 50.

When receiving an information sharing request transmitted from one motor driving control device 50 out of the plural motor driving control devices 50, the controller 2a outputs an information sharing instruction to the motor driving control device 50 which has transmitted the information sharing request while causing the switch unit 6 to set the communication line 4 connected to one or more motor driving control devices 50 associated with the above motor driving control device 50 to the enable state. When the motor driving control device 50 that has transmitted the information sharing request receives the information sharing instruction, the motor driving control device 50 outputs cooperation information corresponding to the state of the motor driving control device 50. When receiving cooperation information output from another motor driving control device 50 as described above, each of the plural motor driving control devices 50 controls the driving of the motor 20 based on the received cooperation information. Accordingly, the plural motor driving control devices 50 can perform the cooperative operation easily and quickly.

Various operations may be performed as the cooperative operation. In the present embodiment, when the motor driving control device 50 falls into the abnormal state or when it returns from the abnormal state to the normal state, the information sharing request is made, and the cooperative operation is performed. Accordingly, when the fan motor 10 falls into an abnormal state, by causing the other fan motors 10 associated with the above fan motor 10 to perform the operation under cooperation, it is possible to compensate for the fan motor 10 which has fallen into the abnormal state. Accordingly, it is possible to prevent or alleviate the deterioration in performance of the motor driving system 1 as a whole.

In the control device 2, the controller 2a and the switch unit 6 are arranged on the same circuit board. The wiring for connecting each fan motor 10 to the control device 2 may include only one communication line 4 in addition to wiring for supplying power. Since the quantity of wirings connected to each fan motor 10 can be reduced to a small number, the work of arranging the motor driving system 1 in equipment or the like can be easily carried out, and problems that increase depending on the number of wirings are prevented.

[Description on Variant]

The motor driving control device 50 that has output the information sharing request (for example, the first motor driving control device 50a) may output cooperation information containing instruction information to a motor driving control device 50 which receives the information sharing request (for example, the second motor driving control device 50b). In this case, the motor driving control device 50 receiving the cooperation information (in the above case, the second motor driving control device 50b) can control the driving of the motor 20 (in the above case, the second motor 20b) based on the instruction information contained in the cooperation information.

The configuration of the switch unit is not limited to the above-described embodiment.

Figure 7:
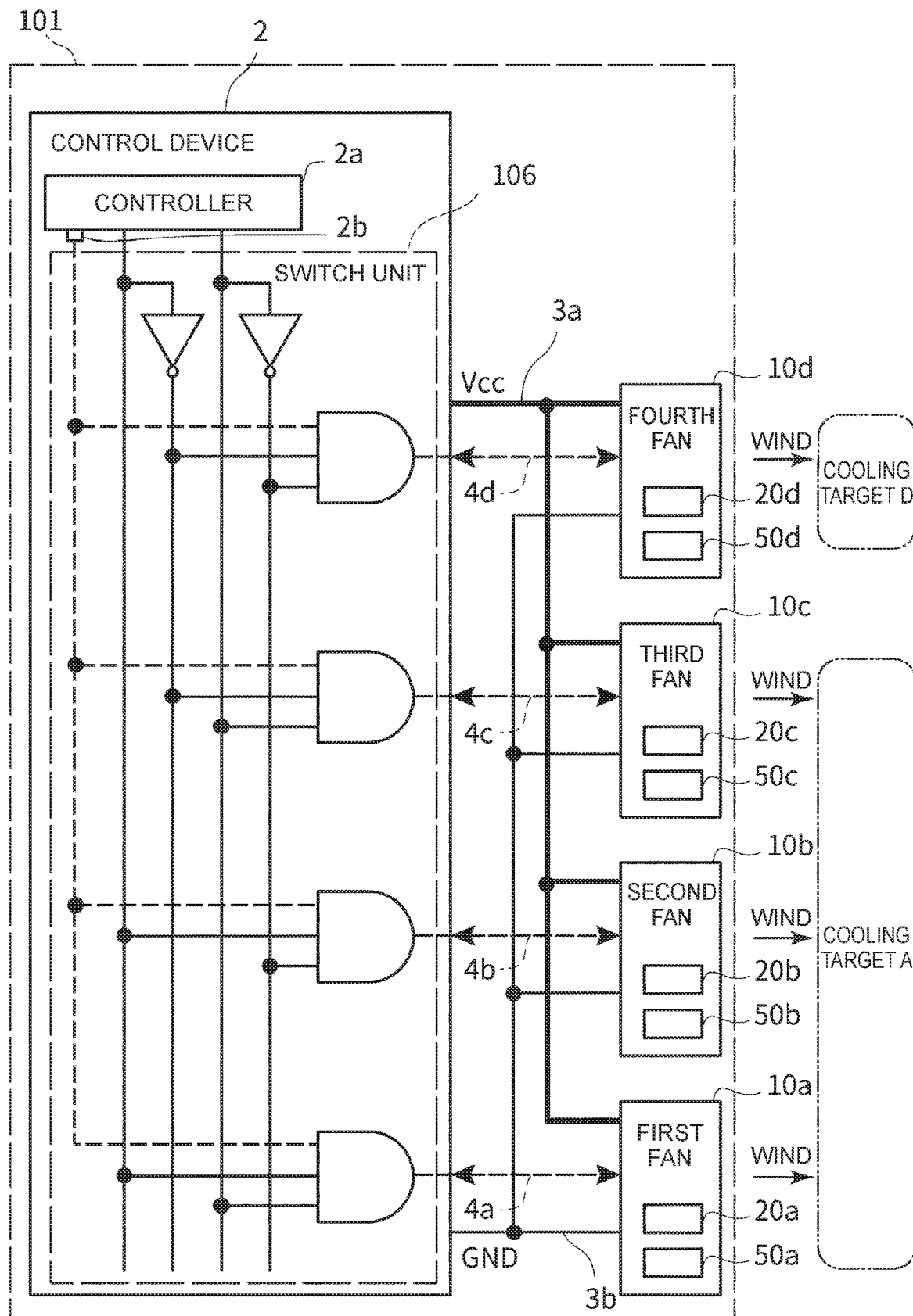
FIG. 7 is a diagram showing a configuration of a motor driving system according to a variant of the embodiment.

FIG. 7 is a diagram showing a configuration of a motor driving system 101 according to a variant of the present embodiment.

As shown in FIG. 7, the motor driving system 101 has a switch unit 106 having a configuration different from that of the switch unit 6 as compared with the motor driving system 1 according to the above-described embodiment. Since the other configurations are the same, the same reference numerals are applied.

The switch unit 106 is configured by using a demultiplexer. That is, the switch unit 106 has one data input from the common terminal 2b of the controller 2a, and two selective control inputs connected to the controller 2a. The switch unit 106 has four data outputs each connected to the motor driving control device 50 of the fan motor 10. That is, based on the control of the selective control input of the controller 2a, the switch unit 106 sets one of four communication lines 4 for connecting the common terminal 2b and the respective motor driving control devices 50 to the enable state, and sets the other communication lines 4 to the disable state. The communication line 4 set to the enable state can be switched alternatively.

By using a demultiplexer for the switch unit 106 as described above, it is possible to reduce the number of terminals of the controller 2a necessary for controlling the switch unit 106. Accordingly, the circuit scale of the controller 2a can be reduced. Particularly, when an integrated circuit is used as the controller 2a, a more inexpensive one can be used, and the manufacturing cost of the motor driving system 101 can be reduced.

[Others]

The circuit configuration of the motor driving system is not limited to specific examples as shown in the above embodiment and the variant of the embodiment. The individual components of the above-described embodiment and the variant of the embodiment may be appropriately combined and configured so as to meet the object of the present disclosure. In addition, various circuit configurations configured to meet the object of the present disclosure can be applied.

The motor driven by the motor driving control device of the present embodiment is not limited to a three-phase brushless motor. The type of the motor may be another type. The number of phases of the motor may be a number other than three.

The motor driving system is not limited to a system using plural fan motors, but may be used in other applications for controlling plural motors.

The number of motors is not limited to four. The motor driving system may be configured so that two or more pairs each including a motor and a motor driving control device are connected to the control device.

The above-described flowcharts and the like show an example to describe the operation, and the present disclosure is not limited to them. The steps shown in the flowchart of each figure are specific examples, and they are not limited to this flow. For example, the order of the steps may be changed or other processing may be inserted between the respective steps, or the processing may be parallelized.

A part or the whole of the processing in the above embodiment may be performed by software or by using a hardware circuit. For example, the control circuit unit is not limited to a microcomputer. At least a part of the internal configuration of the control circuit unit may be processed by software.

A program for executing the processing in the above embodiment may be provided, or the program may be recorded on a storage medium (non-transitory computer readable medium) such as a CD-ROM, a flexible disk, a hard disk, a ROM, a RAM, or a memory card, and provided to a user. The program may be downloaded to a device via a communication line such as the Internet. The processing of the above flowcharts described in the text is executed by a CPU or the like according to the program.

It is to be understood that the above-described embodiment is illustrative in all respects and not restrictive. The scope of the present disclosure is defined not by the above description, but by the scope of the claims, and it is intended to include meanings equivalent to the claims and all modifications within the scope of the claims.

What is claimed is:

1. A motor driving system comprising:
   a first motor;
   a first motor driving control device for driving the first motor;
   a second motor;
   a second motor driving control device for driving the second motor;
   a controller for performing communication with the first motor driving control device and the second motor driving control device;
   a first communication line for connecting a common terminal of the controller and the first motor driving control device;
   a second communication line for connecting the common terminal and the second motor driving control device; and
   a switch unit capable of switching each of the first communication line and the second communication line between an enable state in which communication is possible between the controller and the motor driving control device connected to each other by the communication line and an disable state in which communication is impossible between the controller and the motor driving control device under control of the controller, wherein when communicating with the first motor driving control device, the controller controls the switch unit so as to set the first communication line to the enable state and set the second communication line to the disable state, and when communicating with the second motor driving control device, the controller controls the switch unit so as to set the second communication line to the enable state and set the first communication line to the disable state.

2. The motor driving system according to claim 1, wherein the controller outputs command information to the first motor driving control device and the second motor driving control device while causing the switch unit to set both the first communication line and the second communication line to the enable state.

3. The motor driving system according to claim 1, wherein when receiving predetermined first communication information transmitted from the first motor driving control device, the controller outputs an information sharing instruction to the first motor driving control device while causing the switch unit to set the second communication line to the enable state, and when receiving the information sharing instruction, the first motor driving control device outputs second communication information corresponding to the state of the first motor driving control device.

4. The motor driving system according to claim 3, wherein when receiving the second communication information output from the first motor driving control device, the second motor driving control device controls driving of the second motor based on the received second communication information.

5. The motor driving system according to claim 4, wherein when receiving the second communication information corresponding to a state in which the first motor driving control device is abnormal, the second motor driving control device increases rotational speed of the second motor by performing rotational speed increasing control.

6. The motor driving system according to claim 5, wherein the second motor driving control device reduces rotational speed of the second motor by performing rotational speed reducing control when receiving the second communication information corresponding to a state in which the first motor driving control device is normal after performing the rotational speed increasing control due to reception of the second communication information output from the first motor driving control device.

7. The motor driving system according to claim 4, wherein the second communication information contains instruction information for the second motor driving control device which is to receive the second communication information, and the second motor driving control device which has received the second communication information from the first motor driving control device controls driving of the second motor based on the instruction information.

8. The motor driving system according to claim 3, wherein when receiving the second communication information output from the first motor driving control device, the controller controls the switch unit to set the second communication line to the enable state and set the first communication line to the disable state, and outputs command information based on the second communication information.

9. The motor driving system according to claim 1, wherein the switch unit is configured by using a demultiplexer.

10. The motor driving system according to claim 1, wherein the switch unit and the controller are provided on the same circuit board.

11. A motor driving control device for controlling driving of a motor based on a result of communication with an external control device, comprising:
 a first communication unit configured to output predetermined first communication information including an information sharing request to the control device,
 a first reception unit configured to receive an information sharing instruction output from the control device after the first communication unit outputs the first communication information; and
 a second communication unit configured to output second communication information corresponding to a state of the motor driving control device to the control device and one or more other motor driving control devices when the first reception unit receives the information sharing instruction.

12. The motor driving control device according to claim 11, further comprising:
 a second reception unit configured to receive the second communication information output from another motor driving control device; and
 a control unit configured to control driving of the motor based on the received second communication information when the second reception unit receives the second communication information.

13. A non-transitory computer readable medium that stores therein a control program of a motor driving control device for controlling driving of a motor based on a result of communication with an external control device, the control program causing a computer to execute:
 a first communication step of outputting predetermined first communication information including an information sharing request to the control device;
 a first reception step of receiving an information sharing instruction output from the control device after the first communication step outputs the first communication information; and
 a second communication step of outputting second communication information corresponding to a state of the motor driving control device to the control device and one or more other motor driving control devices when the first reception step receives the information sharing instruction.

* * * * *